(12) United States Patent
Karashima et al.

(10) Patent No.: US 7,759,162 B2
(45) Date of Patent: Jul. 20, 2010

(54) FLIP CHIP MOUNTING PROCESS AND FLIP CHIP ASSEMBLY

(75) Inventors: Seiji Karashima, Osaka (JP); Yoshihisa Yamashita, Kyoto (JP); Satoru Tomekawa, Kanagawa (JP); Takashi Kitae, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 11/662,286

(22) PCT Filed: Sep. 7, 2005

(86) PCT No.: PCT/JP2005/016423

§ 371 (c)(1),
(2), (4) Date: May 21, 2007

(87) PCT Pub. No.: WO2006/030674

PCT Pub. Date: Mar. 23, 2006

(65) Prior Publication Data

US 2008/0017995 A1     Jan. 24, 2008

(30) Foreign Application Priority Data

Sep. 15, 2004 (JP) ............................ 2004-267919
Mar. 28, 2005 (JP) ............................ 2005-091347

(51) Int. Cl.
    *H01L 21/00* (2006.01)
(52) U.S. Cl. ..................... 438/108; 257/777; 257/778
(58) Field of Classification Search .................. None
    See application file for complete search history.

(56) References Cited

U.S. PATENT DOCUMENTS 4,611,192 A * 9/1986 Arora ........................ 337/165

(Continued)

FOREIGN PATENT DOCUMENTS

EP        1 615 263        1/2006

(Continued)

OTHER PUBLICATIONS

OSHA Chemical Sampling Information—Butyl Carbitol.*

(Continued)

*Primary Examiner*—Ha Tran T Nguyen
*Assistant Examiner*—Shantanu C Pathak
(74) *Attorney, Agent, or Firm*—Wenderoth, Lind & Ponack, L.L.P.

(57) ABSTRACT

A flip chip mounting process includes the steps of supplying a resin (13) containing solder powder and a convection additive (12) onto a wiring substrate (10) having a plurality of electrode terminals (11), then bringing a semiconductor chip (20) having a plurality of connecting terminals (11) into contact with a surface of the supplied resin (13), and then heating the wiring substrate (10) to a temperature that enables the solder powder to melt. The heating step is carried out at a temperature that is higher than the boiling point of the convection additive (12) to allow the boiling convection additive (12) to move within the resin (12). During this heating step, the melted solder powder is allowed to self-assemble into the region between each electrode terminal (11) of the wiring substrate (10) and each connecting terminal (21) of the semiconductor chip to form an electrical connection between each electrode terminal (11) and each connecting terminal (21). Finally, the resin is cured so as to secure the semiconductor chip (20) to the wiring substrate (10).

3 Claims, 8 Drawing Sheets

U.S. PATENT DOCUMENTS

| | | | |
|---|---|---|---|
| 5,145,532 | A | 9/1992 | Fukunaga et al. |
| 6,465,082 | B1 * | 10/2002 | Takezawa et al. ............ 428/209 |
| 6,674,178 | B1 * | 1/2004 | Ikegami ...................... 257/789 |
| 6,773,855 | B1 * | 8/2004 | Iijima et al. .................... 430/18 |
| 7,524,748 | B2 * | 4/2009 | Fujimoto et al. ............ 438/597 |
| 2004/0084206 | A1 | 5/2004 | Tung |
| 2004/0106232 | A1 | 6/2004 | Sakuyama et al. |
| 2006/0201997 | A1 | 9/2006 | Tung |
| 2007/0257362 | A1 | 11/2007 | Karashima et al. |
| 2008/0128664 | A1 | 6/2008 | Kitae et al. |
| 2009/0023245 | A1 | 1/2009 | Kitae et al. |
| 2009/0115071 | A1 | 5/2009 | Karashima et al. |
| 2009/0117688 | A1 | 5/2009 | Karashima et al. |
| 2009/0126876 | A1 | 5/2009 | Karashima et al. |

FOREIGN PATENT DOCUMENTS

| | | |
|---|---|---|
| EP | 1 796 155 | 6/2007 |
| EP | 1 830 399 | 9/2007 |
| EP | 1 865 549 | 12/2007 |
| EP | 1 865 550 | 12/2007 |
| EP | 1 873 819 | 1/2008 |
| JP | 1-157796 | 6/1989 |
| JP | 2-251145 | 10/1990 |
| JP | 6-125169 | 5/1994 |
| JP | 9-27516 | 1/1997 |
| JP | 11-186334 | 7/1999 |
| JP | 2000-94179 | 4/2000 |
| JP | 2000-332055 | 11/2000 |
| JP | 2001-329048 | 11/2001 |
| JP | 2002-26070 | 1/2002 |
| JP | 2004-260131 | 9/2004 |
| WO | WO 2004070827 A1 * | 8/2004 |

OTHER PUBLICATIONS

English Translation of Substantial Part of "*Electronics Packaging Technology*", Sep. 2000, pp. 38-45.

Yasuhisa Kaga et al., "*Development of Soldering Technique Through Super Solder*", Technical Report of IEICE, EMD 96-15, Jun. 1996, pp. 23-31.

Masahiro Yasuda, et al. "*Self-Organized Joining Assembly Process by Electrically Conductive Adhesive Using Low Melting Point Fillers*", 10th Symposium on "Microjoining and Assembly Technology in Electronics", Feb. 5-6, 2004, pp. 183-188.

Masahiro Rito et al., "*Assembly Process by Electrically Conductive Adhesive Using Low Melting Point Fillers*", 9th Symposium on "Microjoining and Assembly Technology in Electronics", Feb. 6-7, 2003, pp. 115-120.

Kiyokazu Yasuda et al., "*Self-Organized Packaging Using Polymer Containing Low-Melting-Point-Metal Filler Process Simulation of Viscous Multi Phase Flow Fluid*", 11th Symposium on "Microjoining and Assembly Technology in Electronics", Feb. 3-4, 2005, pp. 239-244.

Takayuki Yamada et al., "*Self Organized Packaging by Polymer Containing Low Melting Point Metal-Expermential Verification of Process Rule Factors of Self-Organization*", 11th Symposium on "Microjoining and Assembly Technology in Electronics", Feb. 3-4, 2005, pp. 245-250.

Koushi Ohta et al., "*Study of Self-Organization Assembly Process Based on MARS Method 3-Dimensional 2-Phase Flow Analysis*", 12th Symposium on "Microjoining and Assembly Technology in Electronics", Feb. 2-3, 2006, pp. 381-386.

Masao Toya et al., "*Experimental Verification of Lateral Flow Effects in Resin Containing Solder Fillers on Self-Organization Joining Process*", MES2006 (micro electronics symposium), pp. 335-338.

Masaru Yamashita et al., "*Analysis Concerning the Coalescence Behavior of Metal Droplet in Self-Organization Assembly Process*", 13th Symposium on "Microjoining and Assembly Technology in Electronics", Feb. 1-2, 2007, pp. 55-60.

Supplementary European Search Report issued Sep. 14, 2009 in corresponding European Patent Application No. 05 78 2249.

* cited by examiner

FLIP CHIP MOUNTING PROCESS AND FLIP CHIP ASSEMBLY

TECHNICAL FIELD

The present invention relates to a flip chip mounting process for mounting a semiconductor chip over a wiring substrate, and a flip chip assembly. In particular, the present invention relates to a flip chip mounting process that are high in productivity and can be applicable to a fine-pitch semiconductor chip, and also it relates to a flip chip assembly.

BACKGROUND OF THE INVENTION

With a development of high density and high integration of a semiconductor integrated circuit (LSI) used for electronics device, higher pin count and finer pitch of electrode terminals of LSI chip have been rapidly developed in recent years. The LSI chip is mounted over a wiring substrate by generally employing a flip chip mounting process in order to decrease wiring delay. It is common practice in this flip chip mounting process to form solder bumps on the electrode terminals of the LSI chip, and then connect, through such solder bumps, all the electrode terminals to all electrodes formed on the wiring substrate in a batch process.

For mounting a next-generation LSI having 5000 or more electrode terminals over the wiring substrate, it is required to form fine-pitch bumps with its pitch of 100 μm or less. It is, however, difficult for a conventional solder bump forming process to form such fine-pitch bumps. Moreover, from a viewpoint that a large number of bumps must be formed according to the number of the electrode terminals, a high productivity is required for reducing a manufacturing cost by reducing mounting tact time per chip.

Conventionally, there has been developed a plating process and a screen printing process as a bump forming process. The plating process is convenient for achieving the fine pitch, but it is complicated and compromises the productivity. The screen printing process, on the other hand, has a high productivity, but is not convenient for achieving the fine pitch because a mask is used.

Recently, there has been developed several processes for selectively forming solder bumps on electrodes of a LSI chip or wiring substrate. These processes are not only convenient for forming fine bumps, but also convenient for achieving a high productivity since a plurality of the fine bumps can be formed in a batch process. Accordingly they are expected as promising processes that can be applicable to the mounting of the next-generation LSI over the wiring substrate.

According to one of these promising processes, a solder paste comprising a mixture of solder powder and a flux is applied directly onto a substrate having electrodes thereon, and subsequently the substrate is heated so as to melt the solder powder and then form the bumps selectively on the electrodes having high wettability without causing an electrical short circuit between the adjacent electrodes. See Japanese Patent Kokai Publication No. 2000-94179 (which is hereinafter referred to also as "Patent literature 1"), for example.

There is also another process wherein a paste composition (so-called "deposition type solder using chemical reaction") mainly comprising organic acid lead salt and tin metal is applied directly onto a substrate, and subsequently the substrate is heated so as to induce a displacement reaction for Pb and Sn, and thereby Pb/Sn alloy is selectively deposited on electrodes of the substrate. See Japanese Patent Kokai Publication No. H01-157796 (which is hereinafter referred to also as "Patent literature 2") and "Electronics Packaging Technology", issued on September, 2000, pp. 38-45 (which is hereinafter referred to also as "Non-patent literature 1"), for example.

A bump forming process disclosed in Patent literature 1 is specifically designed for preventing a shirt circuit between the adjacent electrodes as well as providing solder powder with wettability to metal by controlling surface oxidation of the solder powder. However, the controlling of an extent and a process of the oxidation is not necessarily enough for satisfying both of "providing of wettability" and "prevention of shirt circuit" that are inherently conflicting requirements. Moreover, in the case of the deposition type solder material disclosed in Patent literature 2, the material takes advantage of a particular chemical reaction, and thus it has low flexibility in a selection of solder composition, making it difficult to use Pb-free solder.

By the way, in a flip chip mounting process employing a conventional bump forming technique, subsequent to mounting a semiconductor chip over a wiring substrate having bumps formed thereon, it is additionally required that a resin (which is called "underfill") is poured into a clearance gap formed between the wiring substrate and the semiconductor chip so as to secure the semiconductor chip to the wiring substrate.

Therefore, there has been developed a flip chip mounting process using anisotropic conductive material wherein opposing electrode terminals of a semiconductor chip and a wiring substrate are electrically connected to each other, and at the same time the semiconductor chip is secured to the wiring substrate. See Japanese Patent Kokai Publication No. 2000-332055 (which is hereinafter referred to also as "Patent literature 3"), for example. In this process, a thermosetting resin comprising electrically conductive particles is supplied between the wiring substrate and the semiconductor chip, and subsequently the semiconductor chip is pressed and at the same time the thermosetting resin is heated. As a result, the electrical connection between the electrode terminals of the semiconductor chip and the wiring substrate, and the securing of the semiconductor chip to the wiring substrate are concurrently achieved.

Furthermore, there is a proposed process for mounting a semiconductor chip over a substrate wherein a resin comprising low-melting-point metal filler (i.e., electrically conductive particles) is used. See Japanese Patent Kokai Publication No. 2004-260131 (which is hereinafter referred to also as "Patent literature 4"), Non-patent literature 1 and "Technical Report of IEICE, EMD96-15" (which is hereinafter referred to also as "Non-patent literature 2"), for example.

In this proposed process, self-aligned formation of metal connection is performed between the substrate and the semiconductor chip by melting metal filler (i.e., electrically conductive particles) contained in the resin. However, according to "10th Symposium on "Microjoining and Assembly Technology in Electronics" Feb. 5-6, 2004, pp. 183-188" (which is hereinafter referred to also as "Non-patent literature 3") and "9th Symposium on "Microjoining and Assembly Technology in Electronics" Feb. 6-7, 2003, pp. 115-120" (which is hereinafter referred to also as "Non-patent literature 4"), there is noting else that the mechanism of the self-aligned formation of the metal connection is studied.

Non-patent literatures 1, 2 and Patent literature 4 disclose that a reducing resin is used as the resin. This reducing resin is a so-called "no-flow type underfill material". See Japanese Patent Kokai Publication No. 2001-329048 (which is hereinafter referred to also as "Patent literature 5"), for example. When acid anhydride serving as a curing agent is added to the reducing resin, the acid anhydride is hydrolyzed to give carboxylic acid, and thereby flux property is obtained.

Patent literature 4 describes that the electrically conductive particles are allowed to aggregate on electrodes due to dispersibility of the particles and wettability, and thereby the lowest content of the particles in the resin is preferably 20% by volume or more, more preferably 30% by volume or more.

DISCLOSURE OF THE INVENTION

Problems to be Solved by the Invention

However, in the case of the above flip chip mounting process using the anisotropic conductive material, an electrical conduction between the opposing electrode terminals is achieved due to a mechanical contact through the electrically conductive particles, and thereby a stability of the electrical conduction is hard to maintain. Moreover, since the electrically conductive particles present between the opposing electrode terminals are retained by a cohesion attributable to the thermal curing of the resin, it is required to adjust elasticity modulus and thermal expansion coefficient of the thermosetting resin as well as to adjust particle size distribution of the electrically conductive particles, and therefore there is a problem that the mounting process is hard to control. That is to say, considering an applicability to the next-generation LSI chip having 5000 or more electrode terminals, the flip chip mounting process using anisotropic conductive material has lots of problems in terms of productivity and reliability.

Therefore, an object of the present invention is to provide a flip chip mounting process that is high in productivity and reliability, and thus can be applicable to a flip chip mounting of the next-generation LSI, as well as an object of the present invention is to provide a flip chip assembly.

Means for Solving the Problems

The present invention provides a flip chip mounting process (which is hereinafter referred to also as "first mounting process") wherein a semiconductor chip having a plurality of connecting terminals are opposed to a wiring substrate having a plurality of electrode terminals so that the connecting terminals are electrically connected to the electrode terminals, said process comprising the steps of:
(1) supplying a resin comprising solder powder and a convection additive onto a surface of the wiring substrate;
(2) bringing the semiconductor chip into contact with a surface of the supplied resin;
(3) heating the wiring substrate up to a temperature that enables the solder powder to melt; and then
(4) allowing the resin to cure.

In the heating step (3) of the wiring substrate, electrical connections are formed by allowing the molten solder powder to self-assemble into regions between the electrode terminals of the wiring substrate and the connecting terminals of the semiconductor chip. In the curing step of the supplied resin, the semiconductor chip is secured to the wiring substrate. The resin to be supplied onto the wiring substrate is a resin composition that comprises the solder powder and the convection additive. It is preferred that a thin film is formed on the wiring substrate by applying such resin composition onto the wiring substrate.

According to the process of the present invention, the solder powder can move easily within the resin composition when the wiring substrate is heated to such an extent that the solder powder melts. As a result, the solder powder can self-assemble easily onto the electrode terminals. From this viewpoint, it is preferred that the wiring substrate is heated up to a temperature that enables viscosity of the resin to decrease.

In one embodiment of the present invention, it is preferred that the heating step of the wiring substrate is carried out at a temperature that is above a boiling point of the convection additive. In another embodiment of the present invention, it is preferred that the boiling convection additive convects within the resin. In further another embodiment of the present invention, it is preferred that the solder powder convects within the resin in the heating step. These embodiments of the present invention may be performed independently, or may be combined with each other, or may be performed all together.

When the convection additive which has boiled by the heating convects in the resin and/or the solder powder convects in the resin, mobility of the solder powder is enhanced so that the molten solder powder can aggregate or agglomerate uniformly. As a result, a uniformly grown solder powder is allowed to self-assemble onto the electrode terminals, making it possible to concurrently or simultaneously form a plurality of the fine connections having higher uniformity. It is not desirable that there is no melted solder powder when the convection additive has boiled. It is therefore preferred that a boiling point of the convection additive is below a melting point of the solder powder. However, the convection additive may boil at the same time when the solder powder begins to melt, or may boil immediately after the melting of the solder powder is completed. Even in this case the convective effect of the convection additive is provided. That is to say, regardless of which of the boiling of the convection additive or the melting of the solder powder occurs first, the effect of the present invention is provided as long as both conditions are satisfied.

In a preferred embodiment of the present invention, the convection additive is at least one material selected from the group consisting of solvent, glycerin, wax (e.g., electron wax or the like), isopropyl alcohol, butyl acetate, butyl carbitol and ethylene glycol. The term "solvent" as used throughout this description and claims means a liquid component (component which remains in liquid phase at room temperature) that constitutes "flux". This "flux" is a so-called flux that is conventionally used for a soldering. Example of the solvent may include an alcohol (e.g., buthylcarbitolacetate and the like) and an organic solvent (e.g., isopropyl alcohol and the like). The effect of the convection additive can be provided even in a case where the above solvent is contained in the flux. In a case where the flux comprising a reducing material and the solvent is used, gas bubble of oxygen may be additionally generated through a reaction of reducing an oxide of the metal (e.g., electrically conductive wiring pattern and electrically conductive particle). In this case, such gas bubble can assist the effect of the convection additive and thus is desirable. Water contained in the wiring substrate also can serve as the convection additive. In a case where the flux is used, the resin used in the present invention may comprise resin, active agent, delustering agent and/or the like, all of which are usually contained in the flux. In other words, the resin used in the present invention may not only the solvent but also some components other than the solvent that is contained in the flux. Namely, the resin may comprise the flux.

In another embodiment of the present invention, the convection additive may be material that can release or generate a component capable of boiling in the heating step. That is to say, the convection additive may be a compound that can newly provide a component capable of boiling under a thermal environment in the heating step. Specifically, such compound may be one which decomposes when heated, so as to generate a component having a similar function to that of the convection additive. Example of such compound may include a hydrate, in particular a crystal water-containing compound such as aluminum hydroxide, dawsonite, ammonium metaborate, barium metaborate, azodicarbonamid or sodium hydrogen carbonate.

In a preferred embodiment, the resin that is to be supplied onto the wiring substrate, namely, the resin composition used for forming the connections comprises any one of thermosetting resin (e.g., epoxy resin), thermoplastic resin (e.g., polycarbonate resin) and photo-setting resin (e.g., light-curable epoxy resin). However, the resin may additionally comprise another resin (e.g., phenol resin) as long as the effect of the present invention is not adversely affected. As will be readily appreciated from this description, in a case of the thermosetting resin, a curing process must not be completed in the heating step, and preferably no curing process is substantially initiated in the heating step. Even in a case where the curing process of the resin is initiated in the heating step, it is preferred that progression of the curing process is substantially curbed. On the other hand, after the formation of the connections, the progression and the completion of the curing process may be performed by further heating the wiring substrate.

In a preferred embodiment of the present invention, the wiring substrate is heated while keeping the semiconductor chip in contact with the surface of the supplied resin in the heating step (3). In this case, it is preferable to hold the semiconductor chip at a constant distance from the electrode terminals of the wiring substrate (namely from the wiring substrate) in order to form a constant gap. In other words, it is preferable to prevent a gap width formed between the wiring substrate and the semiconductor chip from varying in the heating step.

In a preferred embodiment of the present invention, in the heating step (3), the wiring substrate is heated while pressing the supplied resin by applying a constant pressure to the semiconductor chip. In order to prevent a gap width formed between the wiring substrate and the semiconductor chip from varying as described above, the pressure may be applied to the supplied resin during at least a part of the heating step.

The solder powder preferably has a sharp distribution of the particle size. More preferably, the solder powder consists of particles having approximately the same size. In a preferred embodiment of the present invention, in the heating step of the wiring substrate, a constant gap width formed between the electrode terminals and the semiconductor chip is larger than, and preferably much lager than the particle size of the solder powder. For example, a maximum size of the solder powder is preferably less than 100% of the gap with, and more preferably less than 90% of the gap with.

In a preferred embodiment of the present invention, the convection additive boils and migrates as vapor to the outside through a periphery of the gap formed between the wiring substrate and the semiconductor chip in the heating step of the wiring substrate.

In the mounting process of the present invention, the semiconductor chip may be any suitable one to be connected to the wiring substrate, such as LSI chip, memory, photonic element and RF element. In a preferred embodiment, a metal pattern is formed on a flat surface of the semiconductor chip, the flat surface being opposed to the wiring substrate. In this case, the metal pattern has substantially the same configuration as that of the plurality of electrode terminals of the wiring substrate. Incidentally, the wiring substrate may be a semiconductor chip such as LSI chip.

In the process of the present invention, the curing step (4) of the supplied resin can be performed by any suitable method, depending on the resin being used. For example in a case of thermosetting resin, the heating is successively carried out subsequent to the heating step (3). In a preferred embodiment, the resin is cured by successively heating the wiring substrate at a temperature higher than that of the heating step (3). In a case of the light-curable resin (e.g., UV-curable resin), subsequent to the heating step (3), such resin is cured by exposing it to light. In this case, the resin may be exposed to light after cooling the wiring substrate and the semiconductor chip which have been heated by the heating step. Alternatively, the resin may be exposed to light without cooling the wiring substrate and the semiconductor chip. In a case of thermoplastic resin, after the heating step is completed, the resin may be cured by cooling it.

In a preferred embodiment of the present invention, a plurality of the semiconductor chips are brought into contact with a surface of the supplied resin so as to mount such plurality of semiconductor chips over the wiring substrate.

In a preferred embodiment of the present invention, the content of the solder powder contained in the resin ranges from 0.5 to 30% by volume, preferably from 0.5 to 20% by volume. It will be noted that the above content is based on a total volume (at room temperature of 25° C.) of the resin composition consisting of a resin, solder powder, a convection additive and other optional components. As required, the resin may additionally comprise a component that is contained in the flux as described above, for example.

The present invention provides another flip chip mounting process (which is hereinafter referred to also as "second mounting process"). This flip chip mounting process comprises the steps of:

(a) preparing a wiring substrate having a plurality of electrode terminals;

(b) supplying a resin comprising solder powder and a convection additive onto the wiring substrate;

(c) heating the wiring substrate up to a temperature that enables the solder powder to melt, and thereby bumps are formed;

(d) disposing a semiconductor chip having a plurality of connecting terminals over the wiring substrate such that the connecting terminals respectively come into contact with the bumps;

(e) heating the wiring substrate up to a temperature that enables the bumps to melt;

wherein electrical connections are formed between the electrode terminals of the wiring substrate and the connecting terminals of the semiconductor chip.

In the step (c), the molten solder powder is allowed to self-assemble onto the electrode terminals of the wiring substrate, and thereby the bumps are formed on the electrode terminals. It is preferred in the step (c) that the wiring substrate is heated up to a temperature that is above boiling point of the convection additive. It is also preferred in the step (c) that the wiring substrate is heated while keeping a flat plate in contact with a whole upper surface of the supplied resin, and thereby the boiling convection additive preferably convects within the supplied resin. The flat plate preferably has a lower wettability to the molten solder powder, compared with the material that constitutes the electrode terminals and the connecting terminals. For example, a glass plate can be used as the flat plate.

In a preferred embodiment of the present invention, the supplied resin is removed from the wiring substrate after the bumps are formed. This removing of the supplied resin may be performed by any suitable methods. For example, the resin can be removed by ultrasonic cleaning process using an organic solvent.

It is preferred in the heating step (e) that the electrical connections are formed by melting the bumps to alloy contacting surface regions between the connecting terminals and the bumps.

It will be noted that the resin, the solder powder, and the convection additive as described with respect to the first mounting process hold true for those of the second mounting process.

The present invention also provides a resin (i.e., resin composition comprising the solder powder and the convection additive) used in the first and the second flip chip mounting processes. Such resin composition is suitably used for forming bumps on electrodes (electrode terminals) of a wiring substrate or a semiconductor chip when the semiconductor chip is flip-chip mounted over the wiring substrate.

EFFECT OF THE INVENTION

In the flip chip mounting process of the present invention, the molten solder powder can move within the resin in the heating step. In a preferred embodiment, the heating step allows the convection additive (which is contained in the resin) to boil and convect within the resin, and thereby the mobility of the solder powder is enhanced. This results in a uniform aggregation or agglomeration of the molten solder powder in the resin. The uniformly agglomerated solder powder is allowed to grow and self-assemble into the region between each electrode terminal of the wiring substrate and each connecting terminal of the semiconductor chip, the electrode terminal and the connecting terminal having high wettability. As a result, a high uniformity of the connection formed between each electrode terminal and each connecting terminal is achieved. In addition, the semiconductor chip can be secured to the wiring substrate by curing the supplied resin that is present between the wiring substrate and the semiconductor chip. In particular, in a case where a thermosetting resin is used as the resin, a succession of steps according to the present invention can achieve not only an electrical connection between the semiconductor chip and the electrode terminals of the wiring substrate, but also the securing of the semiconductor chip to the wiring substrate, which will lead to a high productivity of the flip chip mounting process.

Furthermore, keeping the semiconductor chip in contact with the surface of the supplied resin serves to prevent the boiling convection additive from escaping as vapor to the outside through the surface of the supplied resin. This can keep an effective convection or movement of the additive in the supplied resin that is present between the wiring substrate and the semiconductor chip, which allows the molten solder powder to self-assemble uniformly into the region between each electrode terminal and each connecting terminal (each electrode terminal is opposed to each connecting terminal). As a result, a high reliability of the flip chip assembly is obtained wherein each electrode terminal is uniformly connected to each connecting terminal.

Furthermore, the solder powder (which is dispersed in the resin) is provided with kinetic energy of convective motion of the boiling convection additives, and thereby the solder powder can effectively self-assemble into the region between each electrode terminal and each connecting terminal. As a result, it is possible to reduce the residual solder powder that has been left outside of each electrical connection formed between each electrode terminal and each connecting terminal. In particular, the residual solder powder can be substantially avoided by preliminary conforming the content of the solder powder contained in the resin to an optimum amount required for the formation of the electrical connections. As a result, electrical insulating properties can be improved at the region between the neighboring electrical connections, which will lead to achievement of the fine pitch of the semiconductor chip.

Figure 1:
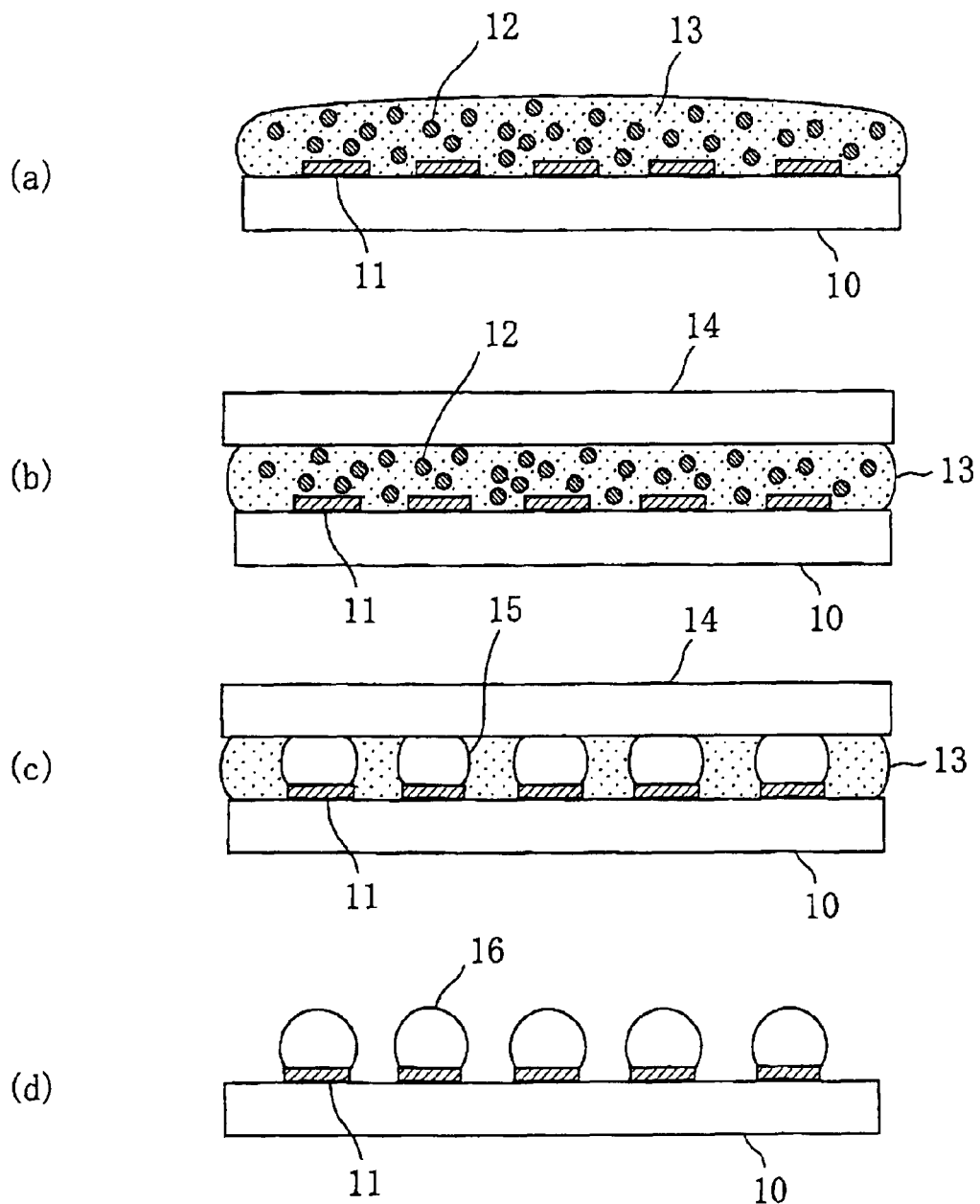
FIGS. 1(a) to 1(d) show cross-sectional views illustrating the steps in a process for forming fine bumps, such process being relevant to the present invention.

In the drawings, the reference numbers correspond to the following elements:
10 : Wiring substrate (wiring board)
11 : Electrode terminal,
12 : Convection additive
13 : Resin
14 : Flat plate
15 : Solder ball
16 : Bump
20 (20a, 20b, 20c, 20d): Semiconductor chip
21 : Connecting terminal
22 : Electrical connection
23 : Underfill material
30 : Central region

BEST MODES FOR CARRYING OUT THE INVENTION

With reference to the attached figures, embodiments of the present invention will be hereinafter described in more detail.

As to the drawings, the constituent elements having a substantially similar function carry the same reference number for ease of the explanation. It will be noted that the present invention will not necessarily be limited to the following embodiments.

First Embodiment

With reference to FIGS. 1(a) to 1(d), a process for forming solder bumps in the second mounting process will be described. First, as shown in FIG. 1(a), a resin 13 comprising solder powder (not shown) and a convection additive 12 is supplied onto a wiring substrate 10 on which a plurality of electrodes 11 are formed. Next, as shown in FIG. 1(b), a flat plate 14 is brought into contact with a surface of the supplied resin 13, at the same time the wiring substrate 10 is heated up to a temperature enabling the solder powder to melt. As a result of this heating, the solder powder is allowed to melt and self-assemble, and thereby the resulting solder balls 15 selectively form and grow up on the electrodes 11, as shown in FIG. 1(c). Finally, the flat plate 14 is moved away from the surface of the supplied resin 13 and then the resin 13 is removed. As a result, the wiring substrate 10 wherein bumps 16 are formed on the plurality of electrodes 11 thereof is obtained as shown in FIG. 1(d).

This process for forming solder bumps is characterized in that the resin comprises not only the solder powder but also the convection additive that is preferably capable of boiling at a temperature that enables the solder powder to melt. In a preferred embodiment, the convection additive boils at a melting point of the solder powder, so that the convection additive in a gas state convects within the resin. This enhances a mobility of the molten solder powder in the resin (such solder powder is considered as being "wafting" in the resin), which leads to a uniform aggregation or agglomeration of the molten solder powder. As a result, a uniformity of the resulting fine bumps is achieved.

keeping the flat plate 14 in contact with the surface of the supplied resin 13 at least prevents the boiling convection additive 12 from escaping as vapor to the outside through the surface of the supplied resin 13. This can effectively keep the convection or movement of the additive 12 within the resin, which leads to a higher uniformity of the resulting fine bumps.

It will be understood that the bump forming mechanism described above with reference to FIGS. 1(a) to 1(d) remains inventors' supposition, and thus the present inventions are not bound by this supposition.

As will be readily appreciated from the above description about the convection additive, the terms "convection", "convect" and "convecting" used regarding the convection additive throughout this description and claims mean not only convection as used in a strict sense, but also various movements of the additive. That is to say, the terms "convection", "convect" and "convecting" are used for descriptive purpose since these terms include "convection" used in a strict sense as one embodiment of the additive movements. Therefore, as long as a movement of the boiling additive contained in the resin 13 gives energy for the solder powder (which is dispersing in the resin 13) to enhance the mobility of the solder powder, such movement shall be included in "convection", "convect" or "convecting" used in this description and claims, regardless of what kind of embodiment such movement has.

Similarly, in a case of the terms "convection", "convect" and "convecting" used regarding the solder powder, these terms mean not only convection as used in a strict sense, but also various movements of the solder powder. That is to say, even in this case, the terms "convection", "convect" and "convecting" are used for descriptive purpose since these terms include "convection" used in a strict sense as one embodiment of the movements of the solder powder.

The present inventors conducted experimental test for comparing a resin containing solder powder only and another resin containing not only solder powder but also an additive (e.g., material capable of boiling at or below a temperature that enables the solder powder to melt). The resin containing the solder powder only and the another resin containing the solder powder and the additive were respectively applied onto a printed board whereon round electrodes were arranged in the form of "array". Subsequently, the heating treatment was carried out while keeping a flat plat into contact with the supplied resins.

Figure 10:
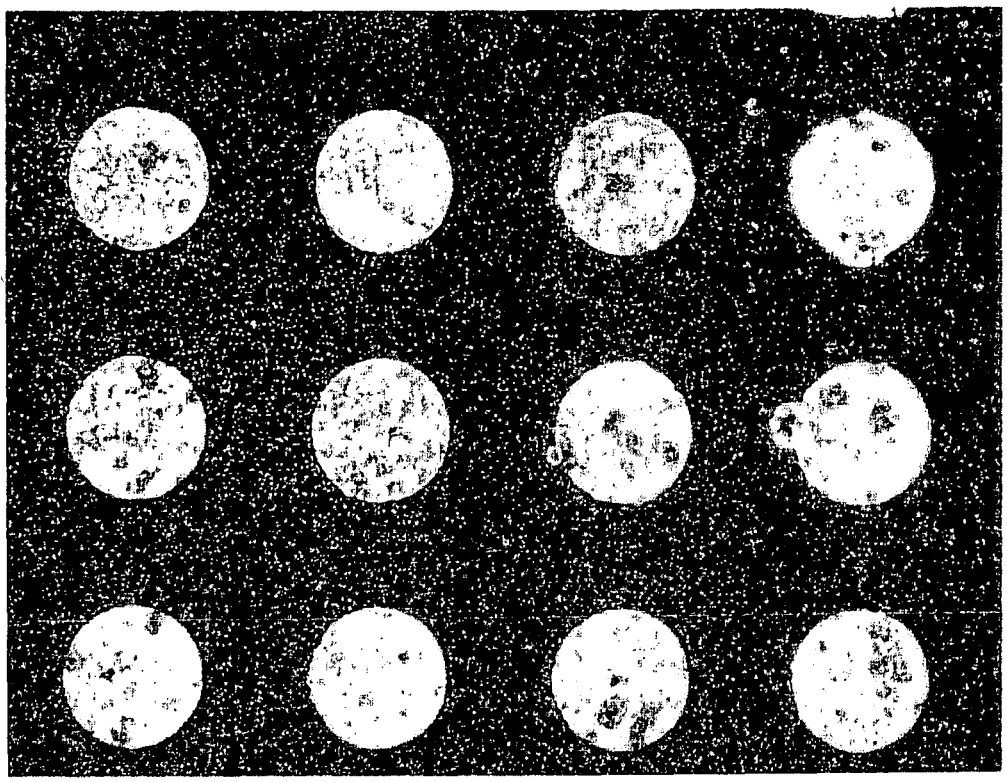
FIG. 10 is a photograph showing the state of a resin containing solder powder in which case the resin has been applied onto round electrodes and then heated.
Figure 11:
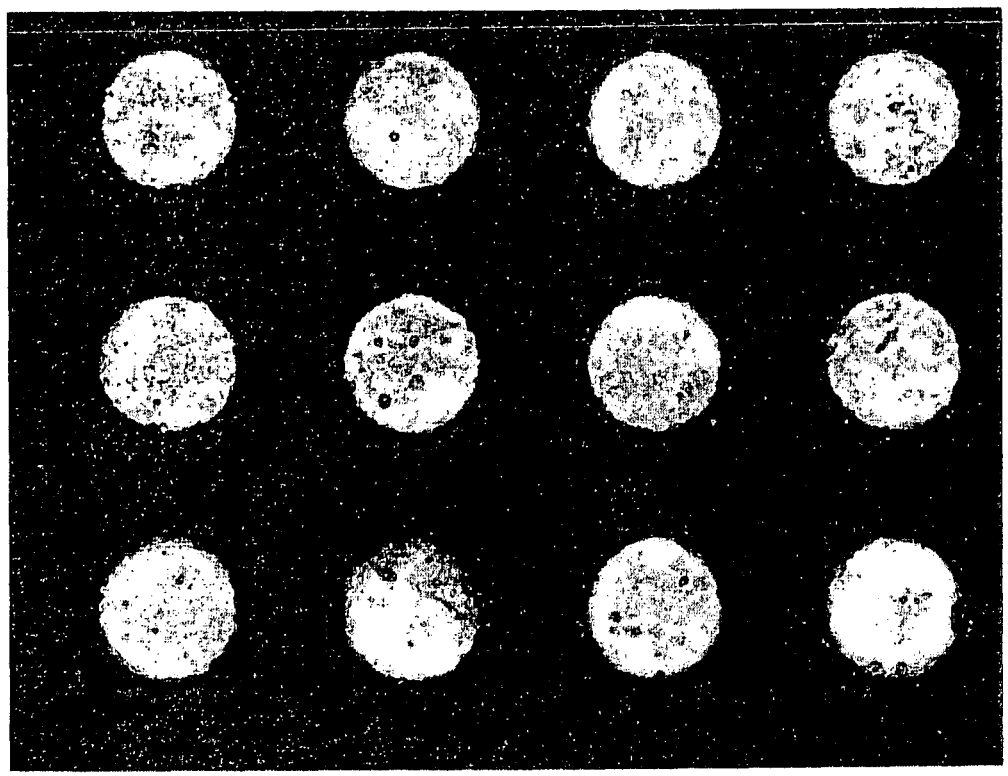
FIG. 11 is a photograph showing the state of a resin containing solder powder and a convection additive in which case the resin has been applied onto round electrodes and then heated.

It was confirmed that there is a difference between the resin containing the additive and the another resin containing no additive as follows:

In the case of the resin containing the solder powder only, a solder layer was not satisfactorily formed, and some solder powder remained dispersed in the region between the round electrodes (see FIG. 10); and whereas In the case of the resin containing the solder powder and the additive, solder bumps were satisfactorily formed on all the round electrodes, and no solder powder remained dispersed in the region between the round electrodes (see FIG. 11).

The above experimental test described above was conducted by using the following materials and conditions:

The resin containing the solder powder only (i.e., the case shown in FIG. 10)
Resin: epoxy resin
Solder powder: SnAgCu (melting point 220° C.)
The proportions of resin and solder powder (resin:solder powder): 50% by weight:50% by weight
Printed board: ALIVH manufactured by Panasonic Electronic Devices Co., Ltd. (Diameter of electrode: 300 μm, pitch: 500 μm)
Heating temperature of the board: 250° C.

The resin containing the solder powder and the convection additive (i.e., the case shown in FIG. 11)
Resin: epoxy resin
Solder powder: SnAgCu (melting point 220° C.)
Convection additive: added as flux (boiling point 170° C.)
The proportions of resin, solder powder and flux (resin:solder powder:flux):45% by weight:50% by weight: 5% by weight
Printed board: ALIVH manufactured by Panasonic Electronic Devices Co., Ltd. (Diameter of electrode: 300 μm, pitch: 500 μm)
Heating temperature of the board: 250° C.

In the case of FIG. 11, it was confirmed that the additive contained in the resin ("additive" is hereinafter referred to also as "convection additive") had boiled under such a temperature condition that the solder powder melted, and that the bumps were gradually formed well on the round electrodes as the boiling convection additive was convecting within the resin. Therefore, it is suggested that "convection" of the convection additive serves to promote the movement of the molten solder powder, which leads to achievement of a uniform aggregation or agglomeration of the molten solder powder. By contrast, in the case of FIG. 10, such uniform aggregation or agglomeration of the molten solder powder could not have been achieved due to the absence of the convection additive.

Viscosity of the resin used in the process of the present invention decreases at a melting point of the solder powder. From this viewpoint, the resin serves as "sea" wherein the molten solder powder is freely wafting and movable. With respect to the process of the present invention, the supplied resin may be removed after the formation of solder bumps, if needed.

A subsequent process after the formation of the solder bumps can be carried out in the same way as a conventional flip-chip mounting process. In other words, a semiconductor chip is disposed on the solder bumps such that electrode terminals of the wiring substrate are desirably opposed to connecting terminals of the semiconductor chip. Subsequently, the wiring substrate and/or the semiconductor chip are/is heated so as to form an electrical connection between the wiring substrate and the semiconductor chip. It is preferred that a connection region between each solder bump and each connecting terminal of the semiconductor chip is alloyed.

By the way, in a case where the resin is a thermosetting resin or the like, the flat plate 14 can be secured to the substrate. In this case, subsequent to the formation of the solder bumps, the supplied resin 10 is not removed, but cured by heating the wiring substrate up to a predetermined temperature.

Based on the idea that the flat plate is secured as described above, the first mounting process of the present invention as described above is created wherein the semiconductor chip is mounted over the wiring substrate. That is to say, in the flip chip mounting process of the present invention, the semiconductor chip is used instead of the flat plate 14 in which case the semiconductor chip is brought into contact with the supplied resin as well as the solder bump forming process is carried out.

Second Embodiment

Figure 2:
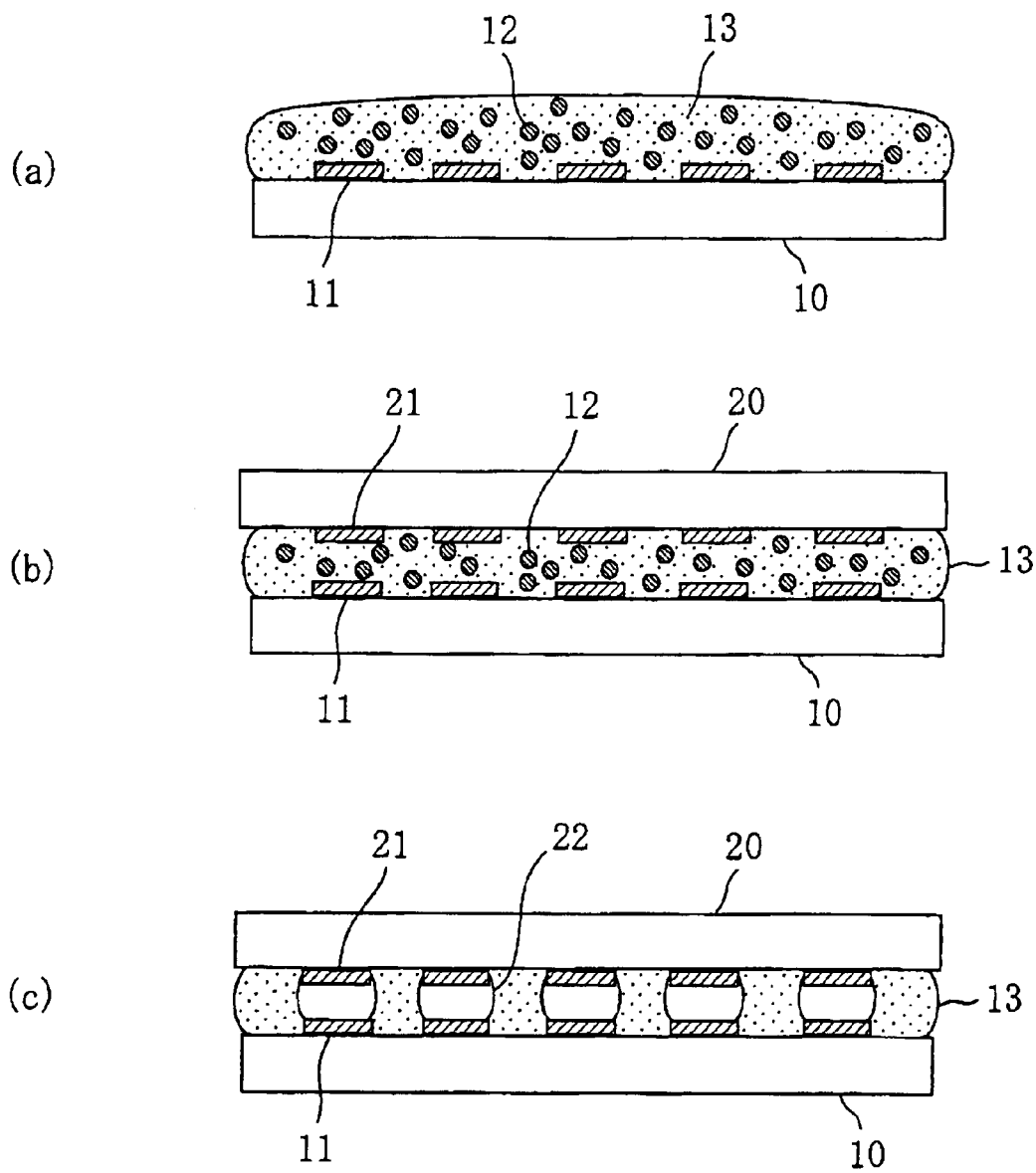
FIGS. 2(a) to 2(c) show cross-sectional views illustrating the steps in a flip chip mounting process of the present invention.

FIGS. 2(a) to 2(c) show views illustrating basic steps in the flip chip mounting process of the present invention according to the second embodiment.

First, as shown in FIG. 2(a), a resin 13 comprising solder powder (not shown) and a convection additive 12 is supplied onto a wiring substrate 10 having a plurality of electrode terminals 11. Next, as shown in FIG. 2(b), a semiconductor chip 20 having a plurality of connecting terminals 21 is brought into contact with a surface of the supplied resin 13 such that the connecting terminals 21 of the semiconductor chip 20 are respectively opposed to the electrode terminals 11 of the wiring substrate 10. Subsequently, the substrate 10 is heated up to or above a temperature that enables the solder powder to melt. In this regard, the heating step of the wiring substrate 10 is performed at or above a boiling point of the convection additive 12, so that the boiling convection additive 12 is allowed to convect within the resin 13.

During this heating step, the molten solder powder is allowed to self-assemble into the region between each electrode terminal 11 of the wiring substrate 10 and each connecting terminal 21 of the semiconductor chip 20. As a result, an electrical connection 22 is formed between each electrode terminal 11 and each connecting terminal 21. This connection 22 serves to electrically connect between each electrode terminal 11 and each connecting terminal 21.

Finally, as shown in FIG. 2(c), the resin is allowed to cure so that the semiconductor chip 20 is secured to the wiring substrate 10.

According to this flip chip mounting process of the present invention, the convection additive 12 contained in the resin 13 boils by the heating, so that the boiling convection additive 12 is allowed to convect within the resin 13. This promotes a movement of the molten solder powder in the resin 13, which leads to a uniform aggregation or agglomeration of the molten solder powder in the resin 13. As a result, the molten solder powder is allowed to grow uniformly and self-assemble into the region between each electrode terminal 11 of the wiring substrate 10 and each connecting terminal 21 of the semiconductor chip 20, the electrode terminal 11 and the connecting terminal 21 having high wettability. This results in a high uniformity of the resulting connection 22 formed between each electrode terminal 11 and each connecting terminal 21. In addition, the semiconductor chip 20 can be secured to the wiring substrate 10 by curing the supplied resin 13 that is located between the semiconductor chip 20 and the wiring substrate 10. Therefore, a succession of steps of the flip chip mounting process can achieve not only an electrical connection between the semiconductor chip 20 and the wiring substrate 10, but also the securing of the semiconductor chip 20 to the wiring substrate 10, which will lead to a high productivity of the process for manufacturing a flip chip assembly.

Keeping the semiconductor chip 20 in contact with the surface of the supplied resin 13 serves to prevent the boiling convection additive 12 from escaping in the form of vapor to the outside through the surface (upper surface) of the supplied resin 13. This can keep an effective convection or movement of the additive 12 in the resin, which allows the molten solder powder to self-assemble uniformly into the region between the opposing terminals (i.e., between each electrode terminal and each connecting terminal). This will lead, to a high reliability of the resulting flip chip assembly.

According to the flip chip mounting process of the present invention, it is possible to reduce the residual solder powder that is left in the outside region of the connection formed between each electrode terminal and each connecting terminal. The reason for this is that the solder powder (which is dispersed in the resin) is provided with kinetic energy of convective motion of the boiling convection additives, and thereby the solder powder can self-assemble effectively into the region between each electrode terminal and each connecting terminal. In particular, the residual solder powder can be substantially avoided by preliminary conforming the content of the solder powder contained in the resin to an optimum content required for the formation of the electrical connections. As a result, electrical insulating properties can be improved at the region between the neighboring electrical connections, which will lead to achievement of the fine pitch of the semiconductor chip.

Turning now to FIGS. 2(a) to 2(c) again, the embodiment of the present invention will be described in more detail.

As shown in FIG. 2(a), the wiring substrate 10 is first prepared in which the electrode terminals are formed on the surface thereof. After sufficiently cleaning the surface of the wiring substrate 10 with acetone or the like, the resin comprising the solder powder (not shown) and the convection additive 12 is applied to the surface of the wiring substrate 10. As the solder powder, Sn—Ag solder powder (e.g., Sn—Ag solder powder with Cu and the like) can be used for example. However, the solder powder used in the present invention is not limited to this Sn—Ag solder powder. For example, the following solder powder can be used:

Pb-free solder powder or Pb—Sn solder powder which is melted to form Sn—Zn alloy or Sn—Bi alloy; or Low-melting-point solder powder which is melted to form Cu—Ag alloy.

It is preferred that the melting point of the solder powder ranges from 100 to 300° C., and more preferably from 130 to 280° C.

As the convection additive 12, a material capable of boiling at or below a temperature that enables the solder powder to melt (e.g., a temperature of from 100 to 300° C. or lower temperature) is preferably used. For example, various solvents used in a resin based-flux that contains an organic acid as an active component can be used as the convection additive. In addition, wax (particularly electron wax or the like), glycerin, isopropyl alcohol, butyl acetate, butyl carbitol, ethylene glycol or the like can be used as the convection additive. The convection additive can boil slightly below the melting point of the solder powder, and preferably it boils at a temperature lower than the melting point of the solder powder by from 10 to 100° C., and more preferably by from 10 to 60° C. Alternatively, the boiling point of the convection additive may be substantially the same as the melting point of the solder powder. Alternatively, the convection additive may boils slightly above the melting point of the solder powder, and preferably it may boil at a temperature higher than the melting point of the solder powder by from 10 to 100° C., and more preferably by from 10 to 20° C.

In a case where the boiling point of the convection additive is lower than the melting point of the solder powder, the solder powder melts after the convection additive boils, and thereafter the boiling convection additive promotes the movement of the molten solder powder. By contrast, in a case where the boiling point of the convection additive is higher than the melting point of the solder powder, the convection additive boils after the solder powder melts, and thereafter the boiling convection additive promotes the movement of the molten solder powder. In both cases, the temperature is increased so as to melt the solder powder in the heating step.

For example, epoxy resin can be used as the resin. In addition, thermosetting resin, thermoplastic resin, photo-setting resin (e.g., UV-curable resin) or the like can be also used as the resin. It is preferred that the resin is capable of decreasing its viscosity at the heating temperature so as to facilitate the movement of the solder powder in a molten or solid state during the heating step.

Subsequent to the application of the resin 13 onto the surface of the wiring substrate 10, the semiconductor chip 20 having the connecting terminals 21 is brought into contact with the surface of the resin 13. In this case, the semiconductor chip 20 is disposed over the wiring substrate 10 such that each connecting terminal 21 of the semiconductor chip 20 is opposed to each electrode terminal 11 of the wiring substrate 10. Incidentally, the connecting terminals 21 of the semiconductor chip 20 are arranged in the form of "area array", and a pitch of the connecting terminals 21 is, but is not limited to, preferably less than or equal to 100 μm.

Subsequently, the wiring substrate 10 is heated up to a temperature that enables the solder powder to melt. In the course of this heating, viscosity of the resin 13 decreases so that the molten solder powder wafts in the resin 13. The heating temperature of the wiring substrate 10 is above the boiling point of the convection additive 12. During this heating step, the convection additive 12 is allowed to boil and convect within the resin 13. The convective flow of the convection additive 12 promotes the movement of the molten solder powder, which leads to a uniform aggregation or agglomeration of the molten solder powder. As a result, the molten solder powder is allowed to grow and self-assemble into the region between each electrode terminal 11 and each connecting terminal 21 which both have high wettability, and thereby each electrical connections 22 is formed therebetween from the solder, as shown in FIG. 2(c).

The boiling convection additive 12 is prevented from escaping in the form of vapor to the outside through the surface of the supplied resin 13 since the semiconductor chip 20 is in contact with the surface of the applied resin 13 in the heating step. As a result, an effective convection of the additive 12 is kept within the resin 13, which allows the molten solder powder to uniformly self-assemble into the region between the opposing terminals (i.e., between each electrode terminal and each connecting terminal).

Finally, the semiconductor chip 20 is secured to the wiring substrate 10 by allowing the resin 13 to cure through the heating of the wiring substrate 10. As a result, there is provided a flip chip assembly wherein each connecting terminal 21 is electrically connected to each electrode terminal 11.

In a case where the thermosetting resin is used as the resin, a curing process may be initiated in the heating step wherein the solder powder moves, but the curing process must not proceed to such a extent that it impedes the effect of the convection additive described above. It is preferred that the curing process does not substantially proceed in the heating step. On the other hand, the cuing process of the resin may proceed after the movement of the solder powder is completed. According to a particularly preferred embodiment, after the melting and the movement of the solder powder are completed, the progression and the completion of the curing process may be performed at a higher temperature than that used for the melting and the movement of the solder powder. Incidentally, in a case where the heating temperature for the melting of the solder powder serves to promote the curing process of the resin after the self-assembling of the solder powder, the heating step may be successively performed so as to cure the resin.

Figure 3:
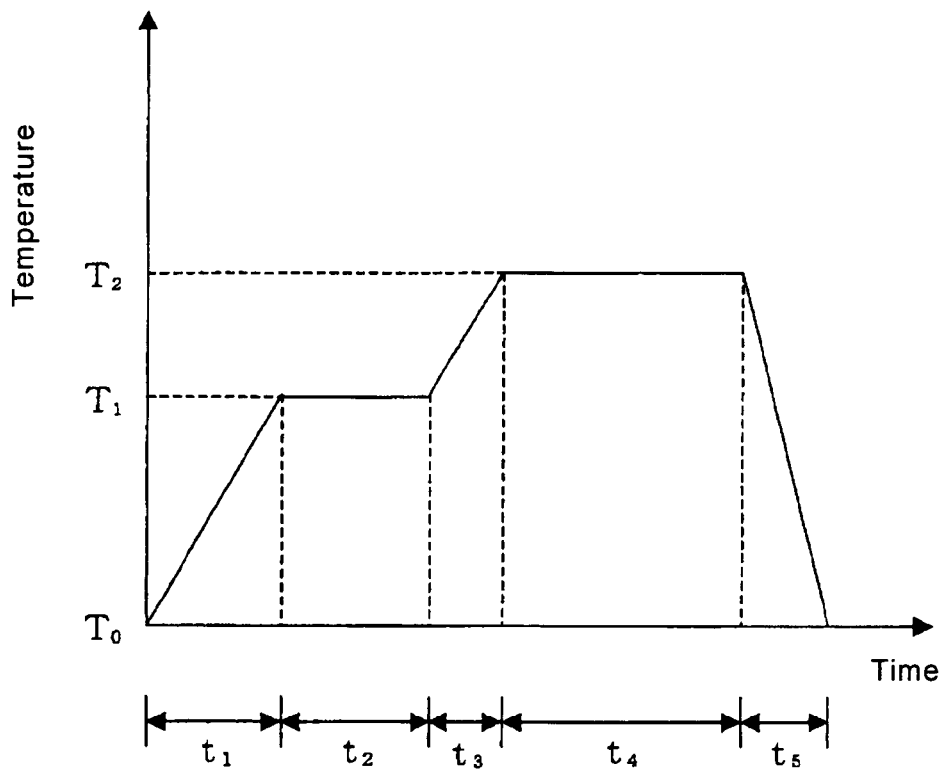
FIG. 3 shows a temperature profile in the course of the heating step of a wiring substrate according to a flip chip mounting process of the present invention.

FIG. 3 shows an example of a temperature profile in the course of the heating step of the wiring substrate 10 according to the flip chip mounting process of the present invention. The horizontal axis shows a heating time of the wiring substrate 10, and the vertical axis shows a heating temperature of the wiring substrate 10.

As shown in FIG. 3, first, the wiring substrate 10 is heated from a room temperature $T_0$ a temperature $T_1$ enabling the solder powder to melt. The solder powder material and the convection additive are respectively selected in such a way that $T_1$ is above the boiling point of the convection additive 12. In a case where Sn—Ag—Cu solder powder is used as the solder powder and a solvent of resin flux having a conventional organic acid as an active component is used as the convection additive 12, $T_1$ can be between 150° C. and 220° C.

While $T_1$ is kept constant in a given time interval $t_2$, "convection" of the boiling convection additive promotes the movement of the solder powder 12 in the resin 13, which leads to the uniform aggregation or agglomeration of the molten solder powder in the resin 13. Since a convective velocity of the boiling convection additive is high and also an aggregation velocity or an agglomeration velocity of the molten solder powder is high, the time interval $t_2$ wherein $T_1$ is kept constant can be enough to be for example between 10 and 20 seconds.

Subsequently, the wiring substrate 10 is heated up to a temperature $T_2$, and then $T_2$ is kept constant in a time interval $t_4$. In the course of this step, the resin 13 is thermally cured so that the semiconductor chip 20 is secured to the wiring substrate 10. In a case where epoxy resin is used as the thermosetting resin, $T_2$ can be between 235 and 260° C. and time interval $t_4$ can be between 10 and 240 seconds.

As will be appreciated from the above, a succession of the heating steps of the flip chip mounting process of the present invention can not only achieve the electrical connection between the semiconductor chip and the wiring substrate, but also achieve the securing of the semiconductor chip to the wiring substrate, which will lead to achievement of a high productivity of the flip chip mounting process.

In a case where the flux is used as the convection additive 12, "convection" of the boiling flux not only can promotes the movement of the molten solder powder, but also can remove an oxide layer which is inevitably formed on the surface of the solder powder.

Although the curing process of the resin 13 can be carried out by successively heating the wiring substrate in the case of the thermosetting resin (e.g., epoxy resin), another material capable of being cured by another means may be used. For example, photo-setting resin (e.g., light-polymerized oligomer), which is capable of being cured by exposing it to light, may be used. In the case of the photo-setting resin, the successive heating steps of the wiring substrate 10 as illustrated in FIG. 3 cannot be employed. However, the case of the photo-setting resin is not inferior to that of the thermosetting resin in terms of an excellent productivity since the curing process of the photo-setting resin can be carried out by a batch process of exposing it to light.

Furthermore, no deformation of the connections (solder) 22 which have grown uniformly can be achieved in the course of the heating of the wiring substrate 10. In this case, in order to prevent the deformation of the grown solder formed between each electrode terminal 11 and each connecting terminal 21, the resin 13 is pressed by applying a constant pressure to the semiconductor chip 20 while keeping the semiconductor chip 20 in place during the heating step(s) of the wiring substrate 10.

By the way, in a case where a flip chip assembly is manufactured by the flip chip mounting process of the present invention, it is preferred that the solder powder is prevented from being left to remain in the outside region of the connection formed between each electrode terminal 11 of the wiring substrate 10 and each connecting terminal 21 of the semiconductor chip 20. Especially in a case where the electrode terminals 21 of the semiconductor chip 20 have fine-pitch arrangement, the residual solder powder remaining in such outside region will not only cause a deteriorating of electrical insulating properties at the region between the neighboring electrical connections, but also cause a short-circuit. Therefore, the avoidance of such residual solder powder is crucial for preventing reliability and process yield from being lowered. For example, material having low wettability to the solder powder can be deposited on the exposed surface(s) of the wiring substrate and/or the semiconductor chip, such exposed surface(s) being provided with no terminal. In one example, a solder mask (solder resist) may be applied onto such exposed surface(s).

The convection additive 12 contained in the resin 13 serves to forcibly move the solder powder (which is dispersing in the resin 13). Therefore, the solder powder can self-assemble more effectively into the region between the terminals than a case where the solder powder self-assembles only by means of "wettability". According to the present invention, it is possible to avoid an excess solder powder to be added into the resin 13. This means that each connection 22 can be formed between the terminals from an optimum amount of the solder powder. It is therefore possible to reduce the residual solder powder that is left in the outside region of the connection 22 formed between each electrode terminal and each connecting terminal. As a result, it is possible to prevent the short-circuit as well as the deterioration of the electrical insulating properties at the region between the neighboring connections.

The optimum content of the solder powder can be determined as follows.

From an assumption that all the solder powder contained in a volume $V_B$ of the resin composition 13 (containing the solder powder and the convection additive) supplied between the wiring substrate 10 and the semiconductor chip 20 contributes to the formation of the connections 21 between the electrode terminals 11 of the wiring substrate 10 and the connecting terminals 21 of the semiconductor chip 20, the following relational formula (1) is supposed to hold for a total volume $V_A$ of the connections 22 and the total volume $V_B$ of the resin composition 13:

$$V_A : V_B \approx S_A : S_B \quad (1)$$

In the relational formula (1), $S_A$ is a total area of the electrode terminals 11 of the wiring substrate 10 (or total area of the connecting terminals 21 of the semiconductor chip 20), and $S_B$ is the surface area of the wiring substrate 10 (or the surface area of the semiconductor chip 20).

Then, the content of the solder powder contained in the resin composition 13 is given by the following formula (2):

$$\text{Content of solder Powder}(\% \text{ by volume}) = V_A/V_B = S_A/S_B \times 100 \quad (2)$$

In fact, all the solder powder might necessarily not self-assemble into the region between each electrode terminal and each connecting terminal, and thus there might be some residual solder powder. Moreover, as long as the electrode terminals are electrically connected to the connecting terminals with a specific requirement, there is no need to completely fill the connection 22 between each electrode terminal and each connecting terminal.

Therefore, the content of the solder powder contained in the resin composition 13 is estimated by the following formula (3):

$$\text{Content of Solder Powder}(\% \text{ by volume}) = (S_A/S_B \times 100) + \alpha \quad (3)$$

In the formula (3), $\alpha$ is a parameter for adjusting excess or shortage in quantity of the solder powder when it self-assembles into the region between each electrode terminal and each connecting terminal. The value of $\alpha$ can be determined in accordance with various conditions. For example, in a case where the resin composition 13 has a low fluidity (i.e., high viscosity), a free movement of the solder powder is impeded in the resin composition 13, which will lead to a lower proportion of the solder powder capable of self-assembling into the region between the terminals. In this case, it is preferable to increase the quantity of the solder powder contained in the resin 13 ($\alpha$ has a positive value) to compensate for the shortage. The self-assembling of the solder powder may be affected by the effect of the convection additive 12 and the wettability of the electrode terminal or the connecting terminal. In order to achieve simplification, parameter $\alpha$ can be determined on an experimental basis, for example by a trial-and-error method.

In this way, $\alpha$ ($\alpha$ is parameter for adjusting excess or shortage in quantity of the solder powder when it self-assembles into the region between each electrode terminal and each connecting terminal) can be determined by various conditions. For example for the purpose of preventing the electrical insulating properties and the like from deteriorating, value of $\alpha$ is preferable set in the range of ±10% by volume, and more preferably in the range of ±5% by volume.

Figure 4:
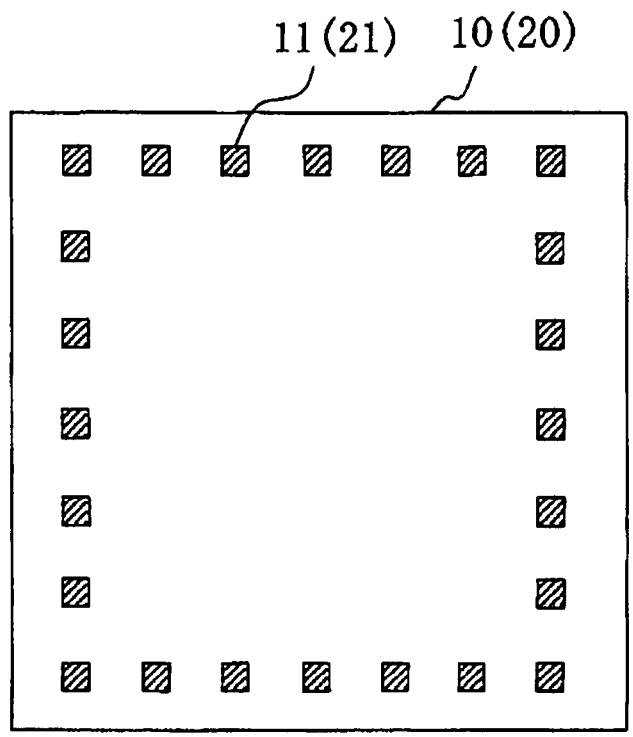
FIG. 4 shows a top plan view illustrating peripheral arrangement of electrode terminals of a wiring substrate according to a flip chip mounting process of the present invention.
Figure 5:
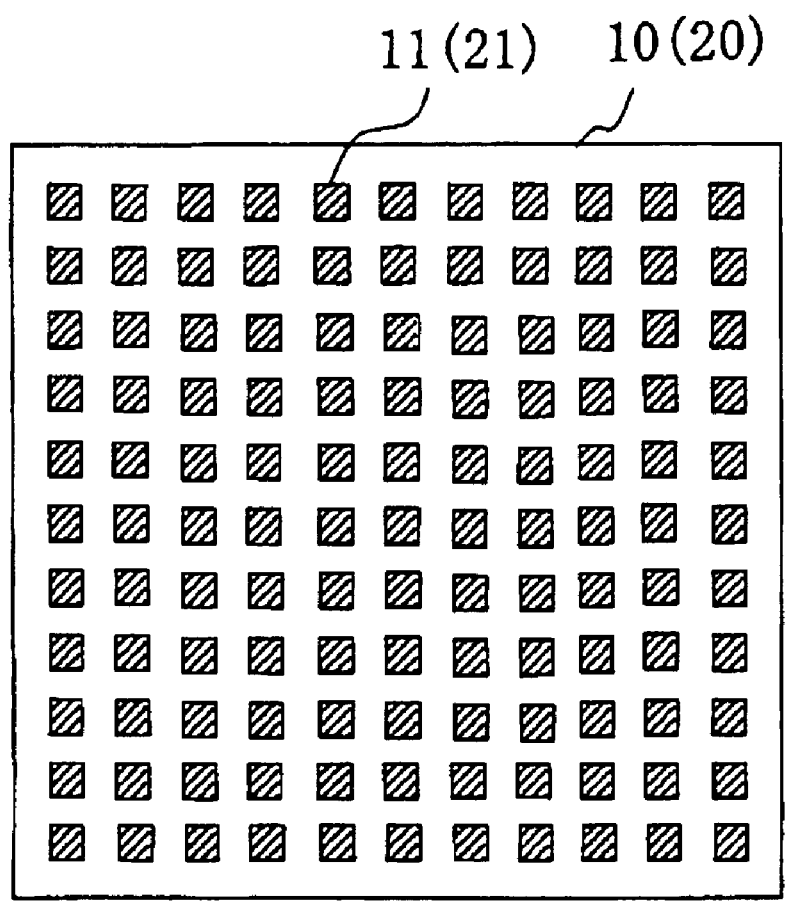
FIG. 5 shows a top plan view illustrating area array arrangement of electrode terminals of a wiring substrate according to a flip chip mounting process of the present invention.

The electrode terminals 11 (or connecting terminals 21) may be disposed in various arrangement on the wiring substrate 10 (or semiconductor chip 20). In the case of a typical arrangement of the electrode terminals 11 (or connecting terminals 21) as shown in FIG. 4 and FIG. 5, the optimum content of the solder powder is determined by the formula (3) as follows:

In the case of the arrangement shown in FIG. 4 (Peripheral arrangement), the optimum content ranges between 0.5 and 5% by volume;

In the case of arrangement shown in FIG. 5 (Area array arrangement), the optimum content ranges between 15 and 30% by volume.

Thus, it can be concluded that it will be sufficient for the resin 13 (i.e., resin composition comprising the solder powder and the convection additive) to have a solder powder content of between 0.5 and 30% by volume, and preferably between 0.5 and 20% by volume in order to form the required connections. It will be understood that such lower content of the solder powder is achieved due to the convective effect of the convection additive which is dispersed in the resin 13. Since the weight ratio of the solder powder and the resin or the convection additive is typically about 7, the content of between 0.5 and 30% by volume is approximately equivalent to a content of between 3 and 75% by weight.

Third Embodiment

Figure 6:
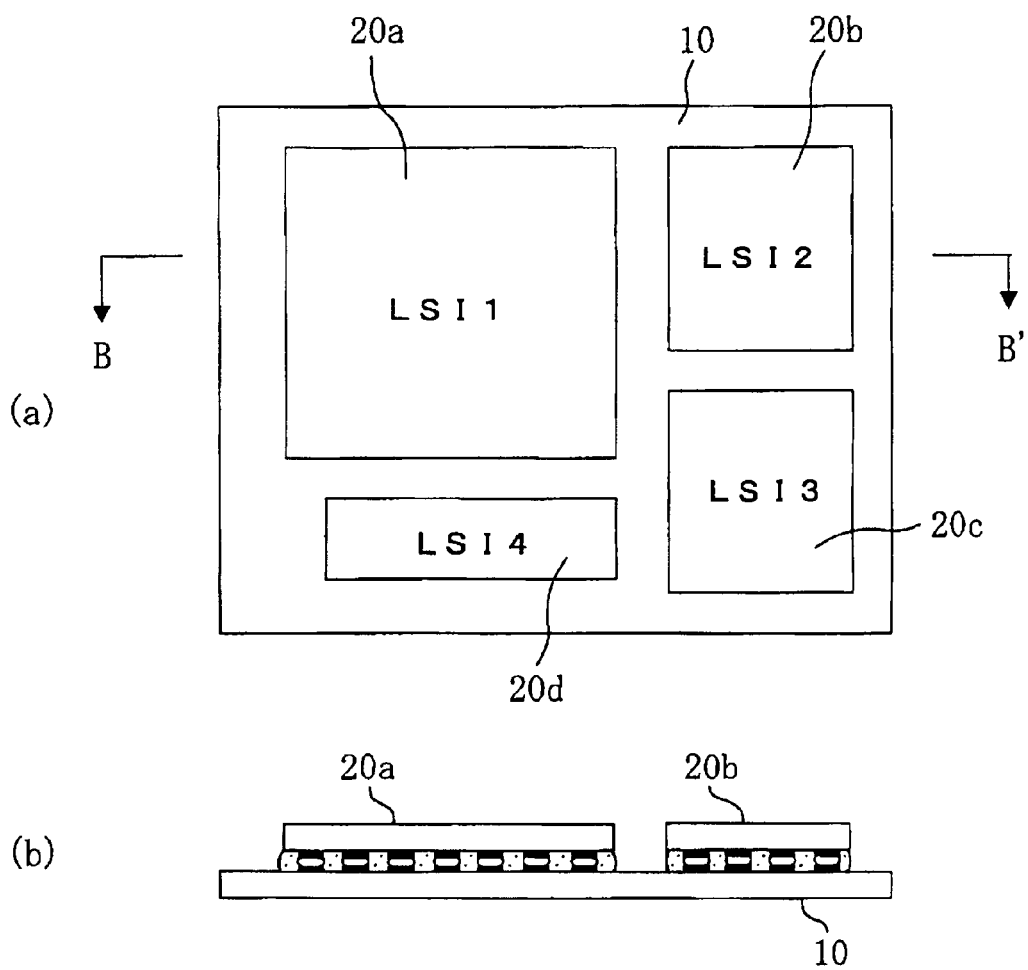
FIG. 6(a) shows a top plan view of a wiring substrate over which a plurality of semiconductor chips are flip-chip mounted.
FIG. 6(b) shows a cross-sectional view of such wiring substrate.

With reference to FIG. 6, the third embodiment wherein the above second embodiment is modified will be hereinafter described.

FIGS. 6(a) and 6(b) show a construction wherein a plurality of semiconductor chips (20a, 20b, 20c and 20d) are flip-chip mounted over a wiring substrate 10. FIG. 6(a) shows a top plan view of such construction, and FIG. 6(b) shows a cross-sectional view of such construction taken along the line B-B' indicated in FIG. 6(a).

A flip chip mounting process for mounting a plurality of semiconductor chips (20a, 20b, 20c and 20d) over the wiring substrate 10 is performed as follows:

First, a resin comprising solder powder and a convection additive is applied to predetermined regions of the wiring substrate 10 wherein the semiconductor chips (20a, 20b, 20c and 20d) are to be mounted. Next, each semiconductor chip is brought into contact with the surface of the applied resin such that each connecting terminal of each semiconductor chip is opposed to each electrode terminal of the wiring substrate 10. Subsequently, the wiring substrate 10 is heated to melt the solder powder contained in the resin. The molten solder powder can aggregate or agglomerate and grow, and is allowed to self-assemble into the region between each connecting terminal of each semiconductor chip and the each electrode terminal of the wiring substrate. Finally, each semiconductor chip is secured to the wiring substrate by curing the applied resin.

According to this flip chip mounting process of the present invention, a succession of steps can not only achieve the electrical connection between each semiconductor chip and the wiring substrate, but also achieve the securing of each semiconductor chip to the wiring substrate, which will lead to achievement of a high productivity of the flip chip mounting process. Instead of applying the resin to the regions wherein semiconductor chips are to be mounted, the resin may be applied to a whole surface region of the wiring substrate 10.

Fourth Embodiment

With reference to FIGS. 7(a) to 7(e), another embodiment of the flip chip process for mounting a semiconductor chip will be hereinafter described.

Figure 7:
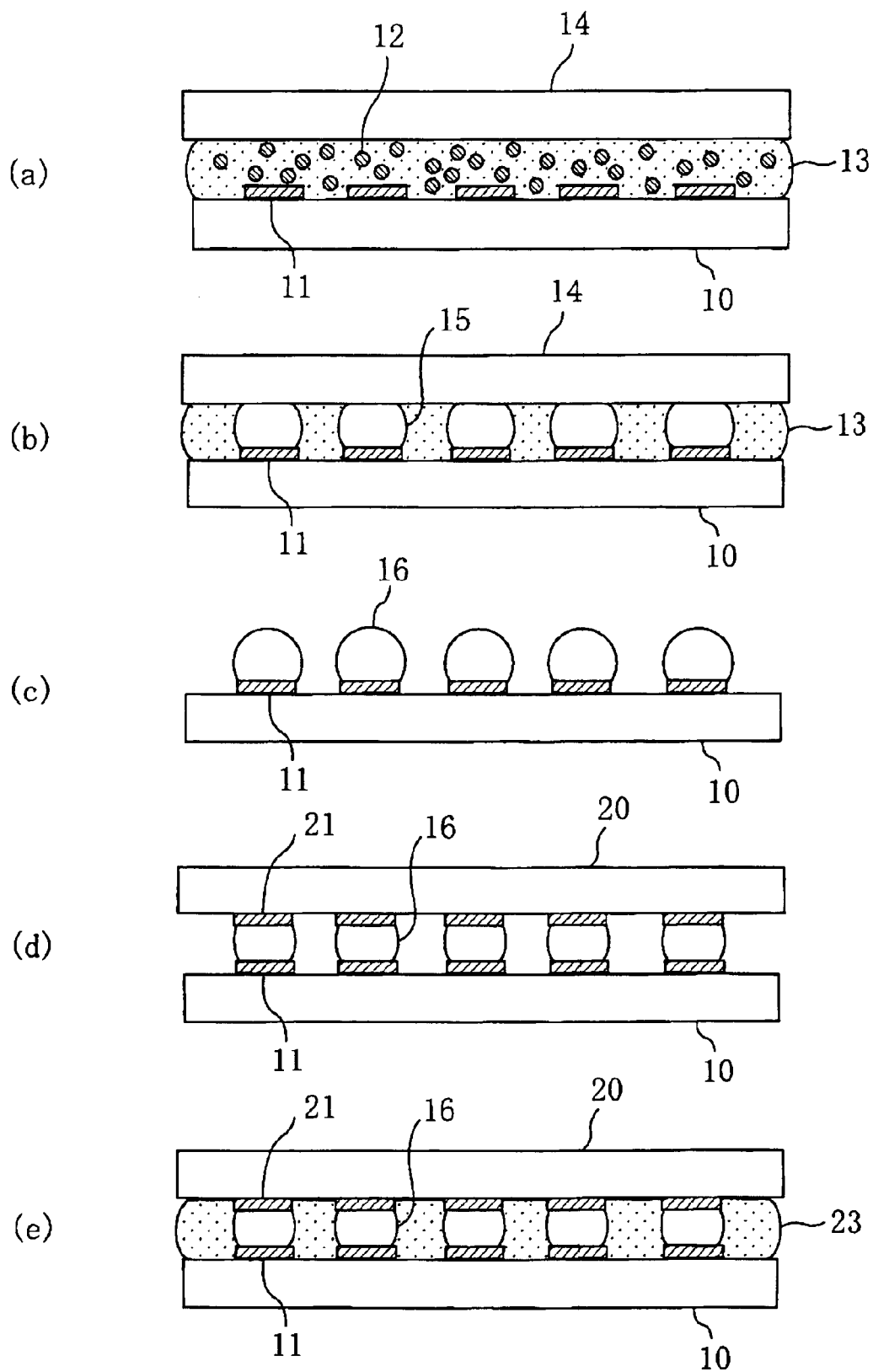
FIGS. 7(a) to 7(c) show cross-sectional views illustrating the steps in another flip chip mounting process of the present invention.

First, as shown in FIG. 7(a), a resin 13 comprising solder powder (not shown) and a convection additive 12 is supplied onto a wiring substrate 10 having a plurality of electrode terminals 11. Next, as shown in FIG. 7(b), a flat plate 14 is brought into contact with a surface of the supplied resin 13. Subsequently, the substrate 10 is heated up to or above a temperature that enables the solder powder to melt. In this regard, the heating of the wiring substrate 10 is performed above a boiling point of the convection additive 12, so that the boiling convection additive 12 preferably convects within the resin 13. During this heating step, the molten solder powder is allowed to self-assemble on electrode terminals 11 of the wiring substrate 10. As a result, solder balls 16 are formed on the electrode terminals 11.

keeping the flat plate 14 in contact with the surface of the supplied resin 13 serves to at least prevent the boiling convection additive 12 from escaping as vapor to the outside through the surface of the supplied resin 13. This can keep an effective convection or movement of the additive 12 within the resin, which promotes a more widespread movement of the molten solder powder.

Next, by moving the flat plate 14 away from the surface of the supplied resin 13 followed by removing such resin 13 from the surface of the wiring substrate 10, there is provided the substrate 10 having the solder bumps 16 formed on the electrode terminals 11 thereof, as shown in FIG. 7(c). In this regard, the resin 13 may be left to remain on the surface of the wiring substrate 10 after the flat plate 14 is moved away. However, since there might be a minute scale of the residual solder powder left within the resin 13, it is therefore preferred in terms of a connecting reliability that such residual solder powder is removed by removing the supplied resin 13.

Next, as shown in FIG. 7(d), a semiconductor chip 20 having a plurality of connecting terminals 21 is mounted over the wiring substrate 10 such that each connecting terminal 21 comes into contact with each solder bump 16. The wiring substrate 10 is then heated up to a temperature that enables the solder bumps 16 to melt while pressing the semiconductor chip 20 toward the solder bumps 16 in order to alloy a contacting surface region between each connecting terminal 21 and each solder bump 16. As a result, the electrode terminals 11 of the wiring substrate 10 are electrically connected to the connecting terminals 21 of the semiconductor chip 20.

Finally, as shown in FIG. 7(e), an underfill material 23 is poured into a clearance gap formed between the wiring substrate 10 and the semiconductor chip 20, followed by heating the wiring substrate 10 in order to thermally cure the underfill material 23.

In the fourth embodiment of the flip chip mounting process, the electrical connection between the semiconductor chip and the wiring substrate, and the securing of the semiconductor chip to the wiring substrate cannot be concurrently achieved by the same heating step. However, in the case of the fourth embodiment, it can be confirmed by a visual check whether or not the solder bumps are satisfactorily formed on the electrode terminals of the wiring substrate. This means that defective bumps can be preliminarily removed, which will lead to improvement of process yield in the flip chip mounting process for the semiconductor.

By the way, as the number of the pins used in the semiconductor has been increasing, the connecting terminals of the semiconductor chip tend to be arranged in the form of "area array". However, in a case where a plurality of semiconductor chips are mounted over a wiring substrate, there may be some semiconductor chips having the connecting terminals that are arranged in the form "peripheral array".

According to the flip chip mounting process of the present invention, a uniform arrangement of the electrodes is desirable for allowing the solder powder to self-assemble. Therefore, the semiconductor chip on which connecting terminals are arranged in the form of "area array" is suitable for the flip chip mounting process of the present invention.

Figure 8:
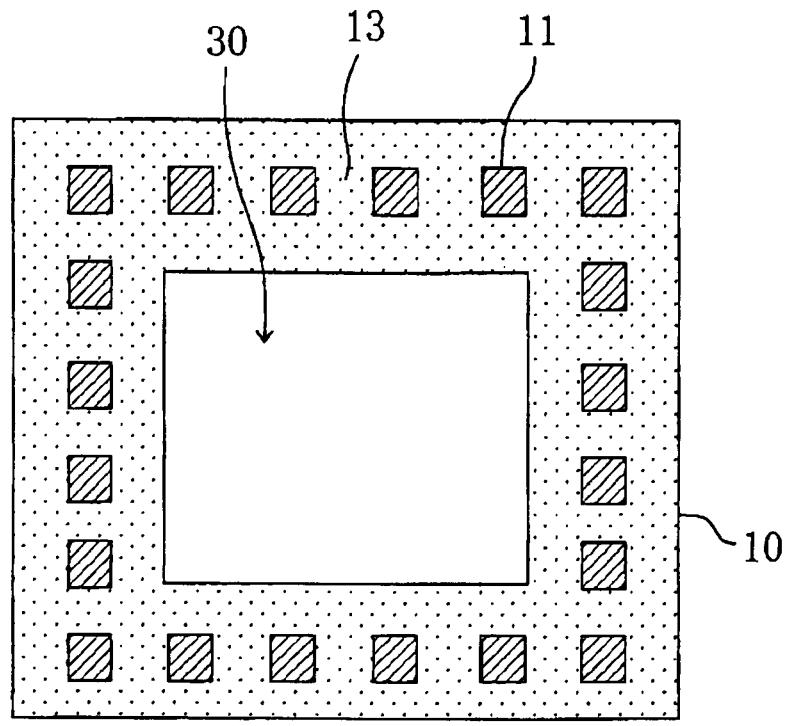
FIG. 8 shows a top plane view of a wiring substrate wherein electrode terminals are disposed on the peripheral part thereof, and a resin is applied to such peripheral part.
Figure 9:
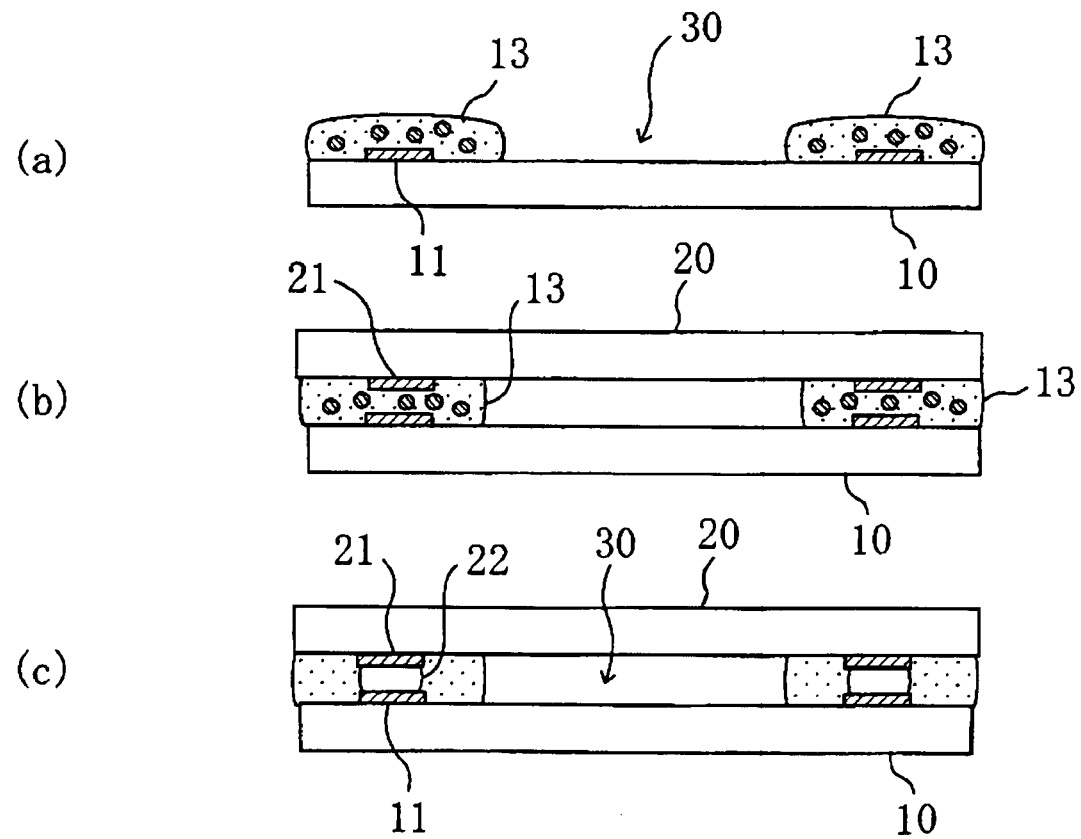
FIGS. 9(a) to 9(c) show cross-sectional views illustrating an embodiment wherein a semiconductor chip on which connecting terminals are peripherally arranged is flip-chip mounted over a wiring substrate.

However, even for a semiconductor chip on which connecting terminals are arranged in the form of "peripheral array", a high uniformity of the flip chip mounting process (such uniformity is similar to that of the case of semiconductor chips having area-arranged connecting terminals) can be achieved according to the embodiments shown in FIG. 8 and FIG. 9. FIG. 8 shows a top plan view of the wiring substrate 10. FIGS. 9(a) to 9(c) show cross-sectional views illustrating the steps in the flip chip mounting process of the present invention.

As shown in FIG. 8, the wiring substrate 10 wherein a plurality of electrode terminals 11 are formed in a peripheral region thereof is prepared, the electrode terminals 11 being arranged so as to oppose to peripheral-arranged connecting terminals of the semiconductor chip. Next, the resin 13 comprising the solder powder and the convection additive is supplied to the wiring substrate 10 such that the electrode terminals 11 are covered with the supplied resin (see FIG. 9(a)). This is to say, no resin 13 is supplied to a central region (where no electrode is formed) of the wiring substrate 10.

Subsequently, as shown in FIG. 9(b), the semiconductor chip 20 is brought into contact with the supplied resin 13, and then the wiring substrate 10 is heated. As a result, as shown in FIG. 9(c), there is provided a flip chip assembly wherein each connecting terminal 21 of the semiconductor chip 20 is electrically connected to each electrode terminal 11 of the wiring substrate 10 via each connection 22.

As shown in FIG. 8, the electrode terminals 11 and the connecting terminals 21 are respectively evenly disposed with respect to the resin 13. This enables the molten solder powder to evenly self-assemble into each region between each electrode terminal and each connecting terminal. As a result, even in the case of the peripheral-arranged connecting terminals, a high uniformity of the flip chip mounting is achieved, which is similar to that of the case of the area-arrayed connecting terminals.

For the flip chip assembly shown in FIG. 9(c), there is no resin on the central region 30 located between the semiconductor chip 20 and the wiring substrate 10. However, in terms of a bonding strength or reliability, such central region 30 may be filled with another resin or the like.

Even in a case where the resin is supplied to a whole surface region of the wiring substrate 10, an advantageous effect of the present invention is not impaired wherein the solder powder can self-assemble into the region between each electrode terminal and each connecting terminal. When the resin is supplied to the whole surface region of the wiring substrate, there is no need to use another resin 30 for filling the central region 30.

The present invention has been hereinabove described with reference to preferred embodiments. It will be however understood by those skilled in the art that the present invention is not limited to such embodiments and can be modified in various ways. For example, although thermosetting resin, photo-setting resin and the like have been exemplified as the resin comprising solder powder and a convection additive, it is possible to parallel use these resins or use a mixture of those two resins. Furthermore, the semiconductor chip is not limited to a silicon semiconductor, but a compound semiconductor can be also used.

The present invention as described above includes the following aspects:

The first aspect: a flip chip mounting process wherein a semiconductor chip having a plurality of connecting terminals are opposed to a wiring substrate having a plurality of electrode terminals so that the connecting terminals are electrically connected to the electrode terminals, the process comprising the steps of:
(1) supplying a resin comprising solder powder and a convection additive onto a surface of the wiring substrate, such surface being provided with the electrode terminals;
(2) bringing the semiconductor chip into contact with a surface of the resin;
(3) heating the wiring substrate up to a temperature that enables the solder powder to melt; and then
(4) curing the resin;

wherein electrical connections are formed between the electrode terminals and the connecting terminals in the step (3), and the semiconductor chip is secured to the wiring substrate in the step (4).

The second aspect: the flip chip mounting process according to the first aspect, wherein the step (3) of heating the wiring substrate is carried out at a temperature that is above a boiling point of the convection additive in the step (3).

The third aspect: the flip chip mounting process according to the second aspect, wherein the convection additive boils and convects within the resin in the step (3).

The fourth aspect: the flip chip mounting process according to any one of the first to third aspects, wherein the solder powder that is in a molten state convects within the resin in the step (3).

The fifth aspect: the flip chip mounting process according to any one of the first to fourth aspects, wherein the convection additive is at least one material selected from the group consisting of solvent, glycerin, wax, isopropyl alcohol, butyl acetate, butyl carbitol and ethylene glycol.

The sixth aspect: the flip chip mounting process according to any one of the first to fifth aspects, wherein the step (3) of heating the wiring substrate is carried out at a temperature that enables viscosity of the resin to decrease.

The seventh aspect: the flip chip mounting process any one of the first to sixth aspects, wherein the wiring substrate is heated while pressing the resin by applying a constant pressure to the semiconductor chip.

The eighth aspect: the flip chip mounting process according to any one of the first to seventh aspects, wherein the resin comprises thermosetting resin.

The ninth aspect: the flip chip mounting process according to the eighth aspect, wherein the step (4) of curing the resin is carried out by heating the wiring substrate up to a temperature higher than the temperature achieved by the step (3).

The tenth aspect: the flip chip mounting process according to any one of the first to seventh aspects, wherein the resin comprises photo-setting resin, and the step (4) of curing the resin is carried out by exposing the resin to light.

The eleventh aspect: the flip chip mounting process according to any one of the first to tenth aspects, wherein a plurality of the semiconductor chips are brought into contact with the surface of the supplied resin so that the plurality of the semiconductor chips are flip-chip mounted over the wiring substrate.

The twelfth aspect: the flip chip mounting process according to any one of the first to eleventh aspects, wherein the content of the solder powder contained in the resin ranges from 0.5 to 30% by volume.

The thirteenth aspect: a flip chip mounting process, comprising the steps of:
(a) preparing a wiring substrate having a plurality of electrode terminals;

(b) supplying a resin comprising solder powder and a convection additive onto the wiring substrate;
(c) heating the wiring substrate up to a temperature that enables the solder powder to melt, and thereby bumps are formed on the electrode terminals;
(d) disposing a semiconductor chip having a plurality of connecting terminals over the wiring substrate in such a way that the connecting terminals respectively come into contact with the bumps;
(e) heating the wiring substrate up to a temperature that enables the bumps to melt;

wherein electrical connections are formed between the electrode terminals of the wiring substrate and the connecting terminals of the semiconductor chip in the step (c).

The fourteenth aspect: the flip chip mounting process according to the thirteenth aspect, wherein the wiring substrate is heated up to a temperature that is above a boiling point of the convection additive in the step (c).

The fifteenth aspect: the flip chip mounting process according to the thirteenth or fourteenth aspect, wherein the convection additive boils and convects within the resin in the step (c).

The sixteenth aspect: the flip chip mounting process according to any one of the thirteenth to fifteenth aspects, wherein, during the step (c), the resin is removed from the wiring substrate after the formation of the bumps.

The seventeenth aspect: a flip chip assembly obtained by the flip chip mounting process according to any one of the first to sixteenth aspects, wherein the electrode terminals of the wiring substrate are electrically connected to the connecting terminals of the semiconductor chip.

INDUSTRIAL APPLICABILITY

The present invention provides a flip chip mounting process that are high in productivity and reliability, and thus that can be applicable to a flip chip mounting of the next-generation LSI. The present invention also provides a flip chip assembly.

CROSS REFERENCE TO RELATED PATENT APPLICATION

The present application claims the rights of priority of Japanese Patent Application No. 2004-267919 (filed on Sep. 15, 2004, the title of the invention: "FLIP CHIP MOUNTING PROCESS AND FLIP CHIP ASSEMBLY"); and priority of Japanese Patent Application No. 2005-091347 (filed on Mar. 28, 2005, the title of the invention: "FLIP CHIP MOUNTING PROCESS AND FLIP CHIP ASSEMBLY"), the disclosures of which are all incorporated herein by reference.

The invention claimed is:

1. A flip chip mounting process comprising:
(a) preparing a wiring substrate having a plurality of electrode terminals;
(b) supplying a resin comprising solder powder and a convection additive onto the wiring substrate;
(c) heating the wiring substrate to a temperature that is at or above a boiling point of the convection additive and the melting point of the solder powder, thereby enabling the solder powder to melt,
wherein the heating of the wiring substrate causes the convection additive to boil, thereby transforming the convection additive to a gas state within the resin, and
wherein convective movement of the convection additive facilitates movement of the solder powder which assembles around the electrode terminals to form bumps on the electrode terminals;
(d) disposing a semiconductor chip, having a plurality of connecting terminals, over the wiring substrate such that the connecting terminals come into contact with the bumps, respectively;
(e) heating the wiring substrate up to a temperature that enables the bumps to melt thereby forming electrical connections between the electrode terminals of the wiring substrate and the connecting terminals of the semiconductor chip; and
(f) contacting a surface of the supplied resin with a plate, prior to heating the wiring substrate, to prevent the boiling convection additive from escaping as gas through the surface of the supplied resin during the heating step.

2. The flip chip mounting process according to claim 1, further comprising removing the resin from the wiring substrate after the bumps are formed and before the semiconductor chip is disposed over the wiring substrate.

3. The flip chip mounting process according to claim 1, removing the plate from the surface of the supplied resin after the heating step and before the semiconductor chip is disposed over the wiring substrate.

* * * * *